(12) United States Patent
Sun et al.

(10) Patent No.: US 10,861,724 B2
(45) Date of Patent: Dec. 8, 2020

(54) SUBSTRATE INSPECTION APPARATUS AND SUBSTRATE PROCESSING SYSTEM INCLUDING THE SAME

(71) Applicant: SAMSUNG ELECTRONICS CO., LTD., Suwon-si (KR)

(72) Inventors: Jongwoo Sun, Hwaseong-si (KR); Hakyoung Kim, Bucheon-si (KR); Yun-Kwang Jeon, Seoul (KR); Wonyoung Jee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 238 days.

(21) Appl. No.: 15/952,317

(22) Filed: Apr. 13, 2018

(65) Prior Publication Data

US 2019/0080944 A1    Mar. 14, 2019

(30) Foreign Application Priority Data

Sep. 12, 2017    (KR) .......................... 10-2017-0116773

(51) Int. Cl.
| | | |
|---|---|---|
| *H01L 21/67* | (2006.01) | |
| *H01L 21/687* | (2006.01) | |
| *H01J 37/32* | (2006.01) | |

(52) U.S. Cl.
CPC .. *H01L 21/67253* (2013.01); *H01J 37/32963* (2013.01); *H01L 21/6719* (2013.01); *H01L 21/67069* (2013.01); *H01L 21/68764* (2013.01); *H01L 21/68785* (2013.01); *H01J 37/3211* (2013.01); *H01J 37/3244* (2013.01); *H01J 2237/334* (2013.01)

(58) Field of Classification Search
CPC ......... H01L 21/67253; H01L 21/67069; H01L 21/68764; H01L 21/68785; H01J 37/32963; H01J 37/3211; H01J 37/3244; H01J 2237/334
USPC ...................................................... 356/237.1
See application file for complete search history.

(56) References Cited

U.S. PATENT DOCUMENTS

| | | | |
|---|---|---|---|
| 7,411,669 B2 * | 8/2008 | Tomita | G03F 7/7065 356/237.1 |
| 8,132,660 B2 | 3/2012 | Park et al. | |
| 9,601,396 B2 | 3/2017 | Lian | |
| 2002/0134179 A1 * | 9/2002 | Maruyama | H01L 21/67796 73/865.8 |
| 2007/0182955 A1 * | 8/2007 | Tomita | G03F 7/7065 356/237.1 |

(Continued)

FOREIGN PATENT DOCUMENTS

| | | |
|---|---|---|
| JP | 2000-193504 A | 7/2000 |
| KR | 10-2007-0042270 A | 4/2007 |

(Continued)

*Primary Examiner* — Roy M Punnoose
(74) *Attorney, Agent, or Firm* — Lee IP Law, P.C.

(57) ABSTRACT

Disclosed are a substrate inspection apparatus and a substrate processing system. The substrate inspection apparatus includes a sensor module and a jig associated with the sensor module to transfer the sensor module. The sensor module may include a housing having a first surface and a second surface facing each other and including an insertion hole connecting the first and second surfaces to each other, a sensor inserted into the insertion hole to measure a state of the substrate, and a tilting member on the housing to adjust tilt of the housing.

20 Claims, 20 Drawing Sheets

(56) References Cited

U.S. PATENT DOCUMENTS

2008/0049218 A1* 2/2008 Kido .................. G02B 21/0016
                                                      356/237.1

FOREIGN PATENT DOCUMENTS

| KR | 10-2007-0073013 A | 7/2007 |
| KR | 10-2007-0105629 A | 10/2007 |
| KR | 10-2011-0087405 A | 8/2011 |

* cited by examiner

FIG. 6
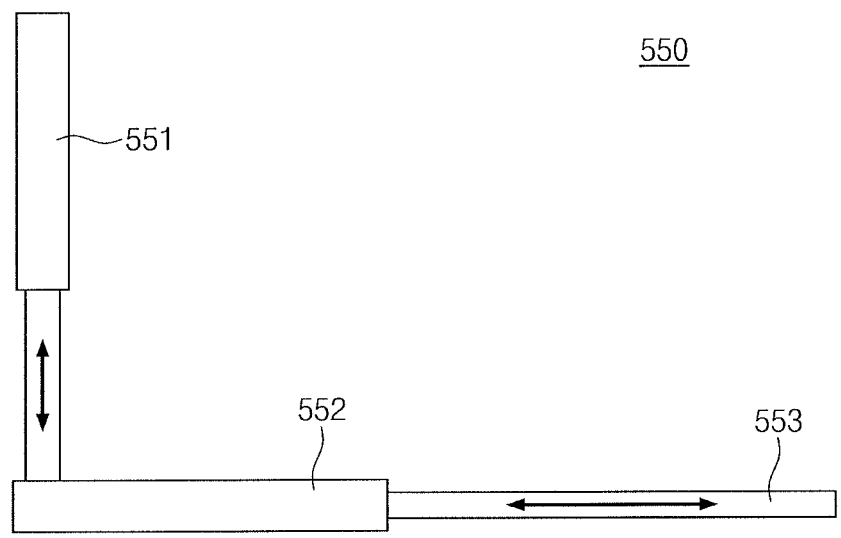
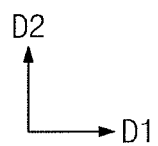

SUBSTRATE INSPECTION APPARATUS AND SUBSTRATE PROCESSING SYSTEM INCLUDING THE SAME

CROSS-REFERENCE TO RELATED APPLICATION

Korean Patent Application No. 10-2017-0116773, filed on Sep. 12, 2017, in the Korean Intellectual Property Office, and entitled: "Substrate Inspection Apparatus and Substrate Processing System Including the Same," is incorporated by reference herein in its entirety.

BACKGROUND

1. Field

Embodiments relate to a substrate inspection apparatus and a substrate processing system including the same.

2. Description of the Related Art

As semiconductor processes increase in fineness and complexity, inspecting particles on a semiconductor device increases in importance. Inspection of particles on semiconductor devices and reduction of particles, may enhance reliability of semiconductor devices and may increase process yield. An optical apparatus may be used to inspect particles on the semiconductor device.

SUMMARY

According to exemplary embodiments, a substrate inspection apparatus may include: a sensor module; and a jig associated with the sensor module to transfer the sensor module. The sensor module may include a housing having a first surface and a second surface facing each other and including an insertion hole connecting the first and second surfaces to each other; a sensor inserted into the insertion hole to measure a state of the substrate; and a tilting member on the housing to adjust a tilt of the housing.

According to exemplary embodiments, a substrate processing system may include a process chamber; a support in the process chamber to support a substrate; a gas supply unit to supply a gas into the process chamber; a plasma source unit to generate plasma from the gas supplied into the process chamber; and a substrate inspection assembly spaced apart from the support across the process chamber. The substrate inspection assembly may include: a sensor module and a jig to drive the sensor module. The sensor module may include a housing including an insertion hole penetrating the housing, a sensor inserted into the insertion hole to measure a state of the substrate on the support, and a tilting member on the housing to adjust a tilt of the housing.

BRIEF DESCRIPTION OF THE DRAWINGS

Features will become apparent to those of skill in the art by describing in detail exemplary embodiments with reference to the attached drawings in which:

FIG. 6 illustrates a simplified schematic diagram showing a jig of FIG. 1.

DETAILED DESCRIPTION

It will be herein discussed in detail embodiments and their exemplary embodiments with reference to the accompanying drawings.

Figure 1:
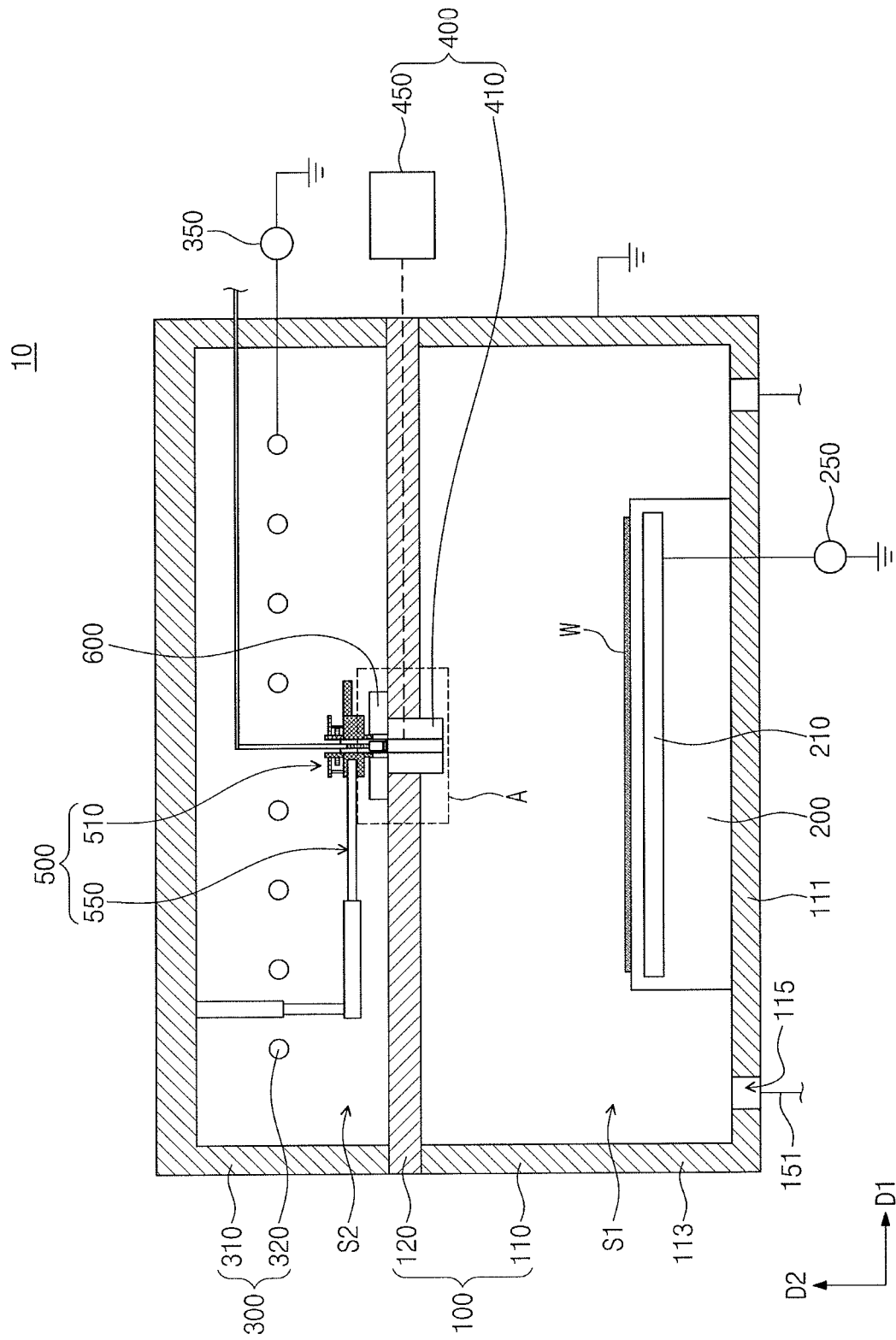
FIG. 1 illustrates a simplified schematic diagram showing a substrate processing system according to exemplary embodiments.
Figure 2:
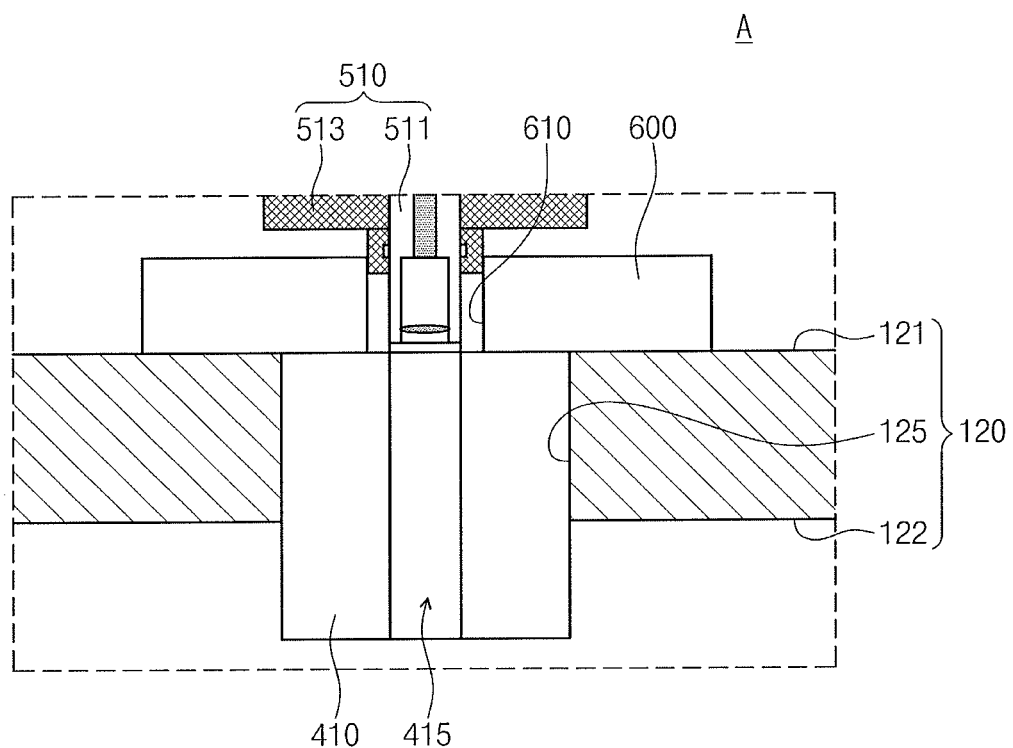
FIG. 2 illustrates an enlarged view showing section A of FIG. 1.

FIG. 1 illustrates a simplified schematic diagram showing a substrate processing system according to exemplary embodiments. FIG. 2 illustrates an enlarged view showing section A of FIG. 1.

Referring to FIGS. 1 and 2, a substrate processing system 10 according to exemplary embodiments may use plasma to treat a substrate W. In some embodiments, the substrate processing system 10 may be or include an inductively coupled plasma (ICP) apparatus capable of performing an etching process on the substrate W. In other embodiments, the substrate processing system 10 may be or include a capacitively coupled plasma (CCP) apparatus. The substrate processing system 10 may include a process chamber 100, a support 200, a plasma source 300, a gas supply 400, and a substrate inspection assembly 500. The substrate processing system 10 may further include a loading member 600.

The process chamber 100 may have therein an inner space S1 (referred to hereinafter as a first space) in which an etching process is performed on the substrate W. The process chamber 100 may be in the ground state. The process chamber 100 may include a process housing 110 and a window 120.

The process housing 110 may have the first space S1 therein and an open top end. The window 120 may cover the open top end and extend along a first direction D1. The window 120 may hermetically seal the first space S1. The process housing 110 may include a bottom wall 111 facing the window 120 across a second direction D2, orthogonal to the first direction D1, and a lateral wall 113 extending from the bottom wall 111 toward the window 120 along the second direction D2. The lateral wall 113 may connect the window 120 and the bottom wall 111 to each other.

The bottom wall 111 of the process housing 110 may have exhaust holes 115 penetrating therethrough. The exhaust holes 115 may be spatially connected to an exhaust line 151. In this configuration, a gas in the first space S1 may be discharged out through the exhaust holes 115 and the exhaust line 151. The process housing 110 may include a metal, e.g., aluminum (Al).

The window 120 may lie on the process housing 110, e.g., may be supported by the lateral wall 113 thereof. The window 120 may have a top surface 121 and a bottom surface 122 facing each other along the second direction D2. In this description, the term "facing" may be intended to mean that components are positioned at opposing sides. The loading member 600 may lie on the top surface 121 of the window 120. The window 120 may be provided in the form of a circular plate.

The window 120 may have an aperture 125 penetrating therethrough along the second direction D2. The aperture 125 may be provided at a center or an approximate center of the window 120, e.g., along the first direction D1. The aperture 125 may spatially connect the top and bottom surfaces 121 and 122 to each other. The window 120 may include a material different from that of the process housing 110. For example, the window 120 may include a dielectric substance.

The support 200 may be located in the process chamber 100. The support 200 may support the substrate W. In some embodiments, the support 200 may use an electrostatic force to hold the substrate W. In other embodiments, the support 200 may support the substrate W in various manners such as mechanical clamping. The support 200 may vertically overlap the aperture 125 along the second direction D2. For example, the support 200 may extend further along the first direction D1 than the aperture 125 and may be substantially centered with the aperture 125.

The support 200 may include an electrostatic electrode 210. The electrostatic electrode 210 may vertically overlap the substrate W along the second direction D2. The electrostatic electrode 210 may be electrically connected to a first power 250. When the electrostatic electrode 210 is supplied with power, an electrostatic force may be generated between the electrostatic electrode 210 and the substrate W. The electrostatic force may cause the support 200 to hold the substrate W.

The gas supply 400 may provide a gas into the process chamber 100. The gas supply 400 may include an injection nozzle 410 and a gas supply part 450. The gas supply part 450 may supply a gas to the injection nozzle 410 through a supply line. The injection nozzle 410 may be placed in the aperture 125 of the window 120. The injection nozzle 410 may have an injection hole 415 penetrating therethrough. The process chamber 100 may be supplied with a gas injected through the injection hole 415 from the gas supply part 450.

The loading member 600 may be provided on the process chamber 100. In some embodiments, the loading member 600 may lie on the top surface 121 of the window 120, e.g., the loading member 600 may partially overlap the top surface 121 along the second direction D2 and may extend along the first direction D1 to partially overlap the aperture 125 along the second direction D2. The loading member 600 may have a loading hole 610 penetrating therethrough. The loading hole 610 may vertically overlap the injection hole 415 and the aperture 125 of the window 120, e.g., may fully overlap the injection hole 415 and partially overlap the aperture 125 along the second direction D2 The loading hole 610 may receive therein a portion of a sensor module 510 of the substrate inspection assembly 500 which will be discussed below. As such, the sensor module 510 may be loaded on the loading member 600.

The plasma source 300 may be provided on the process chamber 100. The plasma source 300 may generate plasma from a gas introduced into the process chamber 100. In some embodiments, the plasma source 300 may include an antenna room 310 and an antenna 320.

The antenna room 310 may have an open bottom end and an inner space S2 (referred to hereinafter as a second space).

The antenna room 310 may be provided on the top surface 121 of the window 120, and the second space S2 may accommodate the antenna 320. The antenna 320 may include ring-shaped coils having different radii from each other. The ring-shaped coils may have centers approximately coinciding with each other. The antenna 320 may be supplied with high-frequency power from a second power 350. When the antenna 320 is supplied with high-frequency power, the antenna 320 may generate a magnetic field. The magnetic field generated by the antenna 320 may active a gas in the process chamber 100 to produce plasma.

The substrate inspection assembly 500 may inspect a state of the substrate W. For example, the substrate inspection assembly 500 may inspect variation in thickness of the substrate W. The substrate inspection assembly 500 may be provided on the process chamber 100. The substrate inspection assembly 500 may be spaced apart from the support 200 across the process chamber 100. For example, the substrate inspection assembly 500 may be installed in the antenna room 310. The substrate inspection assembly 500 may include a sensor module 510 and a jig 550.

The sensor module 510 may include a sensor 511 and a sensor housing 513 in which the sensor 511 is installed. The sensor module 510 will be discussed in detail below.

The jig 550 may be detachably associated with the sensor module 510. The jig 550 may drive the sensor module 510 into the process chamber 100. For example, the jig 550 may transfer the sensor module 510 in the first direction D1 and the second direction D2. The jig 550 may load the sensor module 510 onto, or unload the sensor module 510 from, the loading member 600. In this description, the first direction D1 may be a lateral or horizontal direction and the second direction D2 may be an up-and-down or vertical direction.

As discussed above, when a portion of the sensor module 510 is inserted into the loading hole 610, the sensor 511 may vertically overlap the injection hole 415 of the injection nozzle 410. The jig 550 will be further discussed in detail below.

Figure 3:
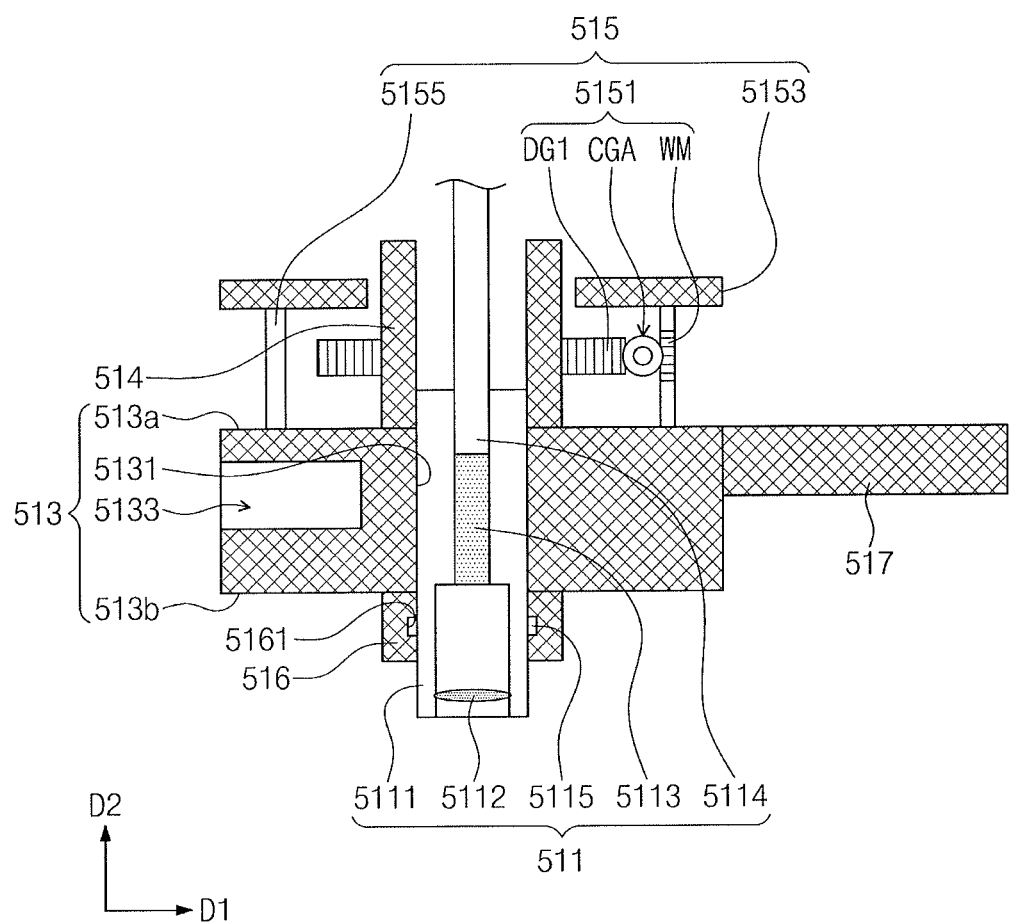
FIG. 3 illustrates a cross-sectional view showing a sensor module of FIG. 1.
Figure 4:
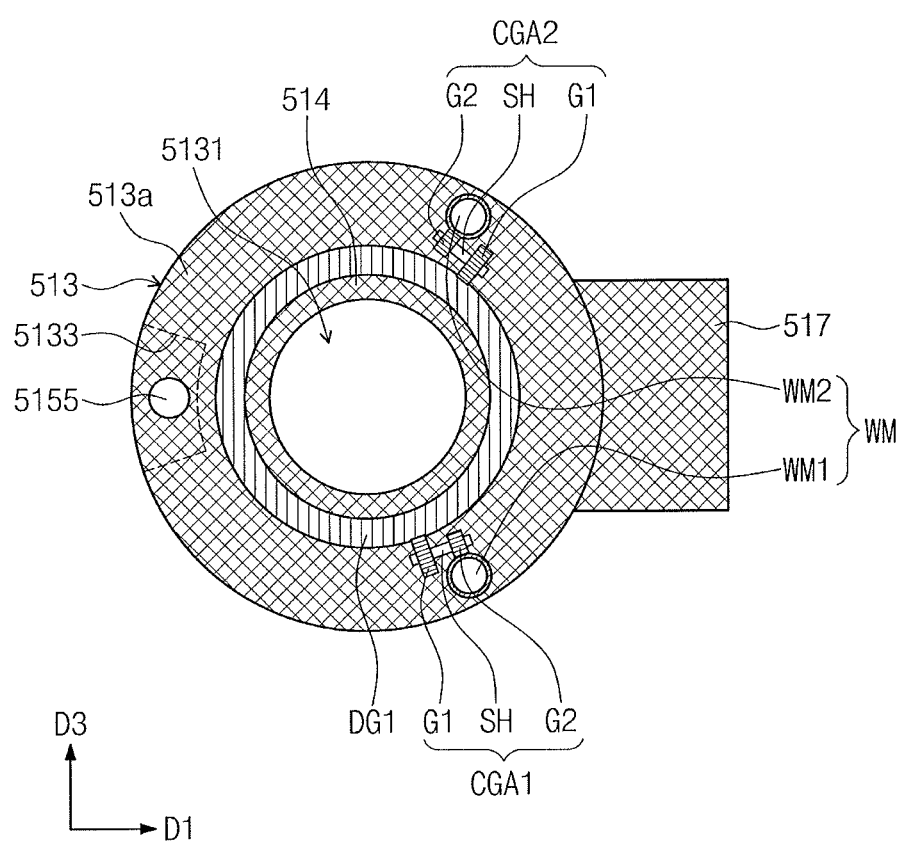
FIG. 4 illustrates a plan view partially showing a sensor module of FIG. 1.
Figure 5:
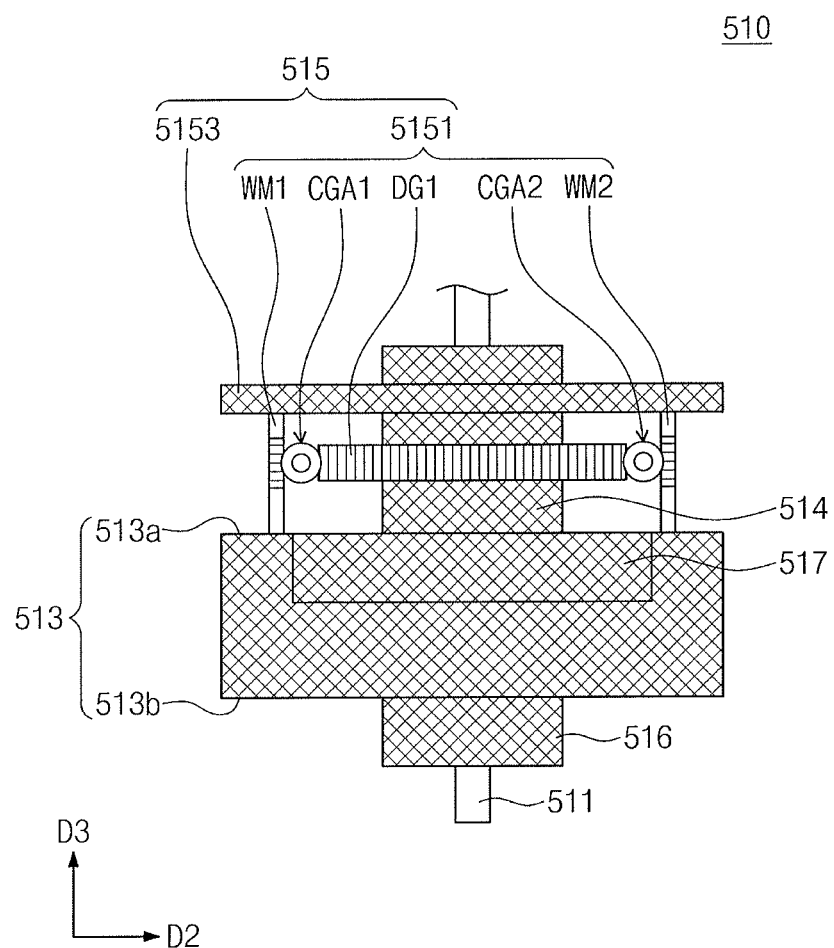
FIG. 5 illustrates a front view showing a sensor module of FIG. 1.

FIG. 3 illustrates a cross-sectional view showing a sensor module of FIG. 1. FIG. 4 illustrates a plan view partially showing a sensor module of FIG. 1. FIG. 5 illustrates a front view showing a sensor module of FIG. 1.

Referring to FIGS. 3 to 5, the sensor module 510 may further include a tilting member 515 in addition to the sensor 511 and the sensor housing 513. The sensor module 510 may still further include a first sidewall part 514, a second sidewall part 516, and a flange part 517.

The sensor housing 513 may have an insertion hole 5131 into which the sensor 511 is inserted. The sensor housing 513 may have a surface 513a (referred to hereinafter as a top surface) and an opposite surface 513b (referred to hereinafter as a bottom surface) facing each other along the second direction D2. The insertion hole 5131 may pass through the sensor housing 513. For example, the insertion hole 5131 may spatially connect the top surface 513a and the bottom surface 513b of the sensor housing 513 to each other. The sensor housing 513 may have a coupling groove 5133 into which the jig (see 550 of FIG. 1) is received. The coupling groove 5133 may extend along a circumference of the sensor housing 513. For example, the coupling groove 5133 may extend along a circumferential direction of the sensor housing 513. When viewed in plan, the coupling groove 5133 may have an arc shape.

The sensor housing 513 may be associated with the sensor 511 inserted into the insertion hole 5131. The sensor 511 may measure a state of the substrate (see W of FIG. 1) placed on the support (see 200 of FIG. 1). In some embodiments, the sensor 511 may irradiate light onto the substrate W and may receive light reflected from the substrate W. The sensor 511 may use the light reflected from the substrate W to obtain a substrate state information. The sensor 511 may be or include an optical sensor, but embodiments are not limited thereto. The sensor 511 may include a body 5111, a lens 5112, a collimator 5113, and an optical fiber 5114. The sensor 511 may further include a coupling protrusion 5115.

The body 5111 may include therein a hollow core penetrating therethrough. The body 5111 may have a cylindrical shape elongated in one direction. The coupling protrusion 5115 may protrude out from a circumferential surface of the body 5111 along the first direction D1. In some embodiments, the coupling protrusion 5115 may be provided in plural arranged at an equal distance along the circumferential surface of the body 5111.

The lens 5112 may be provided in the body 5111. The lens 5112 may allow light to pass therethrough. The collimator 5113 may convert incident light into parallel light. The collimator 5113 may be provided in the body 5111. The collimator 5113 may be spaced apart from the lens 5112. For example, the collimator 5113 may be spaced apart in the second direction D2 from the lens 5112.

The optical fiber 5114 may be connected to the collimator 5113. The optical fiber 5114 may transmit light into, or receive light from, the collimator 5113. The optical fiber 5114 may be connected to a controller or processor provided outside the antenna room (see 310 of FIG. 1). The sensor 511 may transmit the substrate state information through the optical fiber 5114 to the controller. The controller may use the substrate state information measured by the sensor 511 to determine, e.g., whether or not the substrate W is abnormally etched.

The first sidewall part 514 may be provided on the top surface 513a of the sensor housing 513. The first sidewall part 514 may surround the insertion hole 5131. For example, the first sidewall part 514 may extend upward along the second direction D2 from a boundary of the insertion hole 5131. The first sidewall part 514 may have a cylindrical shape. The first sidewall part 514 may surround a portion of the body 5111 that extends along the second direction D2 above the insertion hole 5131.

The second sidewall part 516 may be provided on the bottom surface 513b of the sensor housing 513. The second sidewall part 516 may surround the insertion hole 5131. For example, the second sidewall part 516 may extend downward along the second direction D2 from the boundary of the insertion hole 5131. The second sidewall part 516 may have a cylindrical shape.

The second sidewall part 516 may have a groove 5161 into which the coupling protrusion 5115 is received. The second sidewall part 516 may be inserted into the loading hole (see 610 of FIG. 2). The second sidewall part 516 may vertically overlap the first sidewall part 514, e.g., may have a same width in the first direction D1 such that the first and second sidewall parts 514 and 516 may completely overlap each other along the second direction D2. Inner surfaces of the first and second sidewall parts 514 and 516 may be coplanar along the second direction with the insertion hole 5131. The second sidewall part 516 may surround a portion of the body 5111. A portion of the sensor 511 may be provided below the second sidewall part 516, e.g., may extend along the second direction D2 towards window 120 than the second sidewall part 516.

The flange part 517 may extend from the sensor housing 513, e.g., from the upper surface 513a of the housing along the first direction D1 away from the insertion hole 5131. The flange part 517 may face the coupling groove 5133, e.g., may be spaced apart the coupling groove 5133 along the first direction D1 with the insertion hole 5131 in between.

The tilting member 515 may be provided on the sensor housing 513. The tilting member 515 may tilt the sensor housing 513. For example, the tilting member 515 may change or adjust an inclination of the sensor housing 513. The tilting member 515 may include a support member 5153, a fixing member 5155, and a push-pull unit 5151.

The support member 5153 may be spaced apart in the second direction D2 from the top surface 513a of the sensor housing 513. The support member 5153 may surround the first sidewall part 514. For example, the support member 5153 may have a ring shape. The support member 5153 may have a hole penetrating therethrough. The hole of the support member 5153 may vertically overlap the first sidewall part 514 and the insertion hole 5131, e.g., may be spaced apart from the first sidewall part 514 along the first direction D1 away from the insertion hole 5131.

The fixing member 5155 may connect the sensor housing 513 and the support member 5153 to each other. The fixing member 5155 may be provided between the top surface 513a of the sensor housing 513 and a bottom surface of the support member 5153. The fixing member 5155 may have a pillar shape.

The push-pull unit 5151 may push or pull the sensor housing 513. The push-pull unit 5151 may therefore change the inclination of the sensor housing 513. The push-pull unit 5151 may be provided between the support member 5153 and the top surface 513a of the sensor housing 513. In some embodiments, the push-pull unit 5151 may include a first driving gear DG1, a worm WM, and a connection gear assembly CGA.

The first driving gear DG1 may be placed on the first sidewall part 514, e.g., may extend from the first sidewall part 514 along the first direction D1. The first driving gear DG1 may surround the first sidewall part 514. For example, when viewed in plan, the first driving gear DG1 may have a ring shape. The first driving gear DG1 may be fixed on the first sidewall part 514. An imaginary rotational axis of the first driving gear DG1 may be parallel to the second direction D2.

The worm WM may be spaced apart from the first driving gear DG1. The worm WM may be rotatably installed on the support member 5153 and the sensor housing 513. For example, a bottom end of the worm WM may be rotatably installed on the sensor housing 513. A top end of the worm WM may be rotatably connected to the support member 5153. The worm WM may be provided in plural. The plurality of worms WM may be arranged at an equal distance along a circumference of the first sidewall part 514 and/or along a circumference of the first driving gear DG1. In some embodiments, the push-pull unit 5151 may include a first worm WM1 and a second worm WM2. The first worm WM1, the second worm WM2, and the fixing member 5155 may be arranged at an angle of about 120° around the rotational axis of the first driving gear DG1. The second worm WM2 may be spaced apart in a third direction D3 from the first worm WM1. The third direction D3 may be perpendicular to the first and second directions D1 and D2.

The first worm WM1 and the second worm WM2 may have different screw threads from each other. For example, the first worm WM1 may have a right-handed thread, and the second worm WM2 may have a left-handed thread. When the worm WM has the right-handed thread, the worm WM may be tightened by clockwise rotation. In contrast, when the worm WM has the left-handed thread, the worm WM may be loosened by clockwise rotation. As such, when the first and second worms WM1 and WM2 rotate in the same direction around their own rotational axes, moving directions of the first and second worms WM1 and WM2 may be different from each other.

The connection gear assembly CGA may be provided between the first driving gear DG1 and the worm WM. The connection gear assembly CGA may connect the first driving gear DG1 and the worm WM to each other. The connection gear assembly CGA may transmit a rotational force of the first driving gear DG1 into the worm WM.

The connection gear assembly CGA may be provided in plural. In some embodiments, the plurality of connection gear assemblies CGA may include a first connection gear assembly CGA1 and a second connection gear assembly CGA2. The first connection gear assembly CGA1 may connect the first driving gear DG1 and the first worm WM1 to each other. The second connection gear assembly CGA2 may connect the first driving gear DG1 and the second worm WM2 to each other. The second connection gear assembly CGA2 may be spaced apart in the third direction D3 from the first connection gear assembly CGA1.

Each of the first and second connection gear assemblies CGA1 and CGA2 may include a connection shaft SH, a first gear G1, and a second gear G2.

The connection shaft SH may be vertical to the rotational axis of the first driving gear DG1 and/or to a longitudinal direction of the worm WM. The longitudinal direction of the worm WM may be parallel to a rotational axis of the worm WM.

The first gear G1 may be provided on the connection shaft SH. For example, an end of the connection shaft SH may pass through or may be connected to a center of the first gear G1. The first gear G1 may be engaged with the first driving gear DG1. In some embodiments, the first gear G1 and the first driving gear DG1 may be or include bevel gears.

The second gear G2 may be provided on the connection shaft SH. The second gear G2 may be spaced apart from the first gear G1. For example, an opposite end of the connection shaft SH may pass through or may be connected to a center of the second gear G2. The second gear G2 may be engaged with the worm WM. In some embodiments, the second gear G2 may be or include a worm gear. Operations of the first driving gear DG1, the connection gear assembly CGA, and the worm WM will be discussed below.

FIG. 6 illustrates a simplified schematic diagram showing a jig of FIG. 1. Referring to FIGS. 1 and 6, the jig 550 may include a jig frame 553, a translation member 552, and an elevating member 551. The jig frame 553 may include at least one bar elongated in the first direction D1. An end of the jig frame 553 may be received into the coupling groove (see 5133 of FIG. 3). Therefore, the jig 550 may be associated with sensor module (see 510 of FIG. 1).

The translation member 552 may drive the jig frame 553 to move along a longitudinal direction (e.g., the first direction D1) of the jig frame 553. The translation member 552 may be include drivers to move the jig frame 553 in a linear direction, e.g., along the first direction D1. For example, the translation member 552 may be or include a pneumatic or hydraulic cylinder, but embodiments are not limited thereto. In some embodiments, the translation member 552 may be connected to an opposite end of the jig frame 553.

The elevating member 551 may drive the jig frame 553 to ascend or descend along a direction perpendicular to the longitudinal direction of the jig frame 553. For example, the elevating member 551 may drive the jig frame 553 to ascend or descend along the second direction D2. The elevating member 551 may be various driving means capable of lifting or lowering the jig frame 553. For example, the elevating member 551 may be or include a pneumatic or hydraulic cylinder, but embodiments are not limited thereto. In some embodiments, the elevating member 551 may be connected to the translation member 552. As the elevating member 551 lifts or lowers the translation member 552, the jig frame 553 may ascend or descend.

Figure 7:
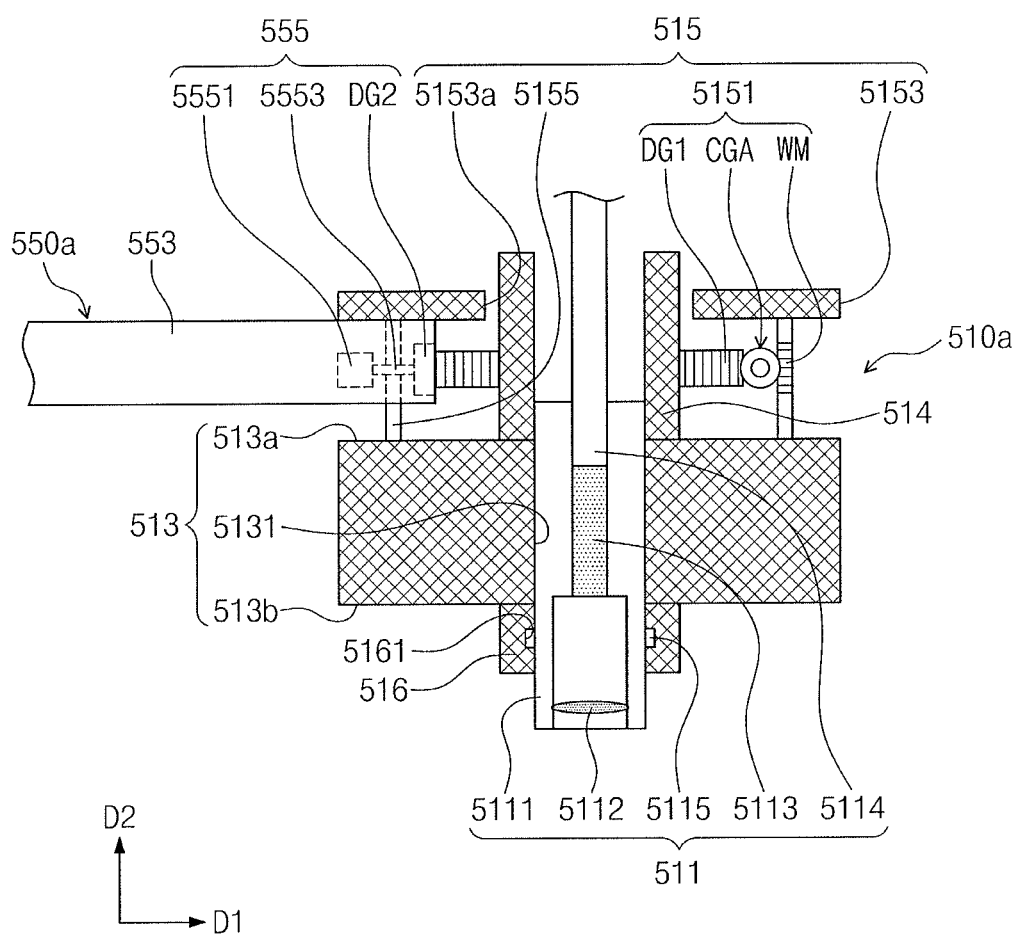
FIG. 7 illustrates a simplified schematic diagram showing other example of a substrate inspection apparatus of FIG. 1.
Figure 8:
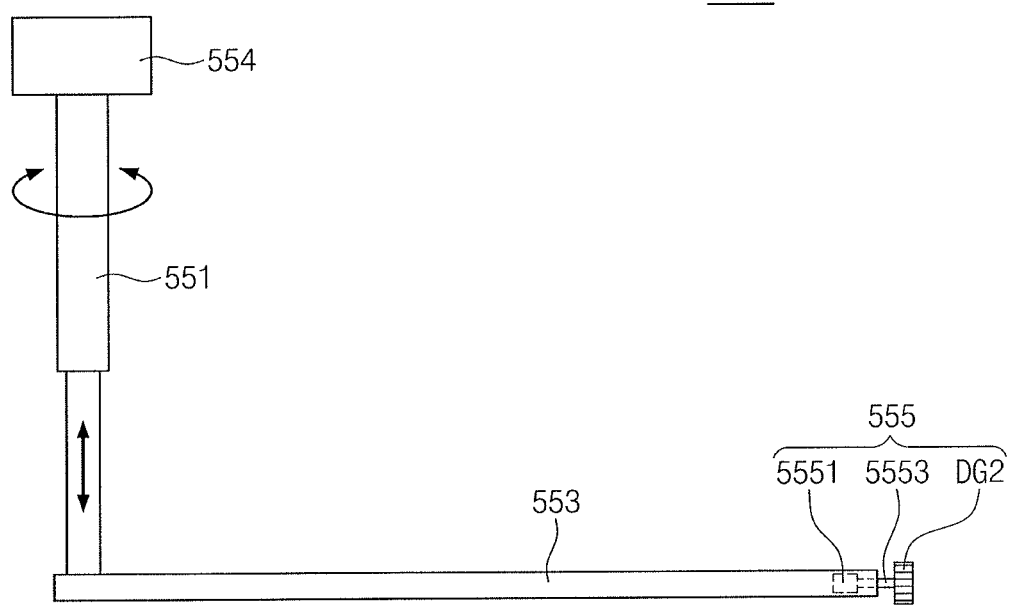
FIG. 8 illustrates a simplified schematic diagram showing a jig of FIG. 7.

FIG. 7 illustrates a simplified schematic diagram showing other example of the substrate inspection apparatus of FIG. 1. FIG. 8 illustrates a simplified schematic diagram showing a jig of FIG. 7. For brevity of description, components substantially the same as those of the embodiments discussed with reference to FIGS. 3 to 6 will be omitted or abbreviated.

Referring to FIGS. 7 and 8, a sensor module 510a may include the sensor housing 513, the sensor 511, the tilting member 515, the first sidewall part 514, and the second sidewall part 516. Unlike the sensor module 510 of FIG. 3, the sensor module 510a may not include the coupling groove 5133 of FIG. 3 and the flange part 517 of FIG. 3.

A jig 550a may include the jig frame 553 and the elevating member 551. Unlike the jig 550 of FIG. 6, the jig 550a may include no translation member 552 of FIG. 6. The jig 550a may further include a rotating member 554 and a driving member 555.

The jig 550a may be inserted between the support member 5153 and the sensor housing 513 to come into contact with the sensor module 510a. For example, an end of the jig frame 553 may be inserted along the second direction D2 between the support member 5153 and the sensor housing 513.

The elevating member 551 may be connected to a portion close to an opposite end of the jig frame 553, e.g., opposite the sensor module 510a along the first direction D1. The rotating member 554 may be connected to the elevating member 551 to thereby rotate the elevating member 551. As the rotating member 554 rotates the elevating member 551, when viewed in plan, the jig frame 553 may move along an arc-shaped trail. The rotating member 554 may be installed in the antenna room (see 310 of FIG. 1). In some embodiments, the rotating member 554 may be or include a rotary motor.

The driving member 555 may rotate the first driving gear DG1. The driving member 555 may be installed on the end of the jig frame 553. In some embodiments, the driving member 555 may include a driving motor 5551, a driving shaft 5553, and a second driving gear DG2. In some embodiments, the driving shaft 5553 may be vertical to the rotational axis of the first driving gear DG1. For example, the driving shaft 5553 may be parallel to the first direction D1, and the rotational axis of the first driving gear DG1 may be parallel to the second direction D2.

The second driving gear DG2 may be connected to an end of the driving shaft 5553. The second driving gear DG2 may be engaged with the first driving gear DG1. In some embodiments, the first and second driving gears DG1 and DG2 may be or include bevel gears, but embodiments are not limited thereto. The driving motor 5551 may be connected to an opposite end of the driving shaft 5553. The driving motor 5551 may rotate the driving shaft 5553.

Figure 9:
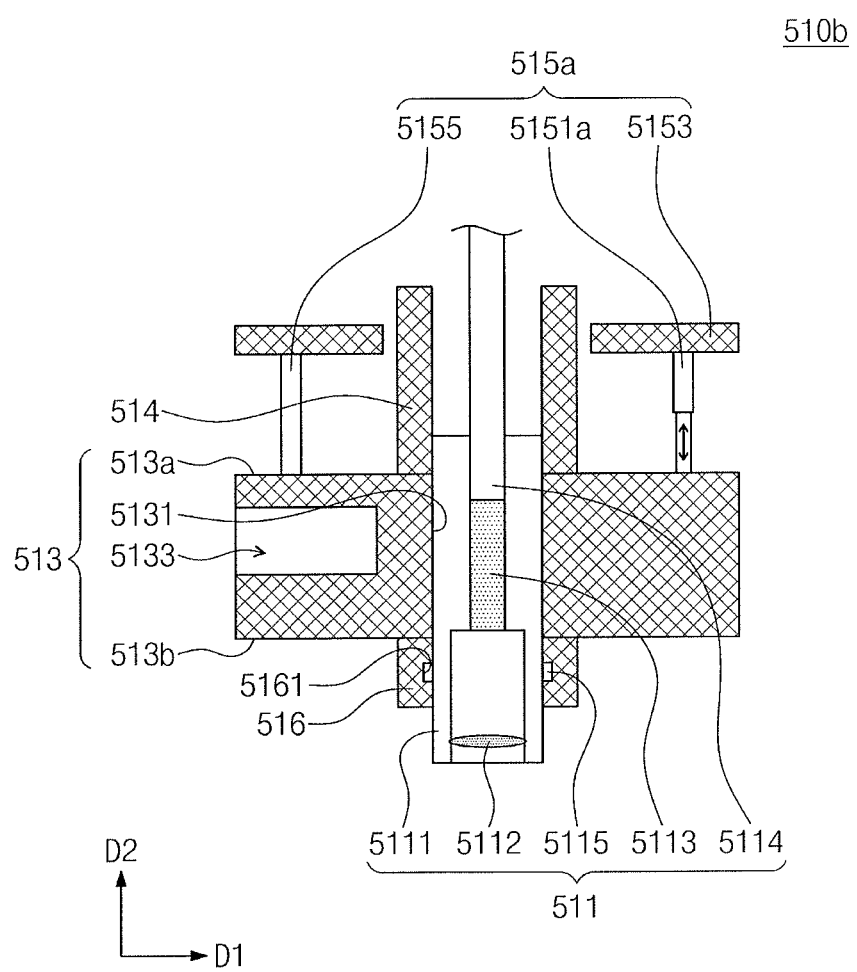
FIG. 9 illustrates a cross-sectional view showing other example of a sensor module of FIG. 1.

FIG. 9 illustrates a cross-sectional view showing other example of a sensor module of FIG. 1. For brevity of description, components substantially the same as those of the embodiments discussed with reference to FIGS. 3 to 6 will be omitted or abbreviated.

Referring to FIG. 9, a sensor module 510b may include the sensor housing 513, the sensor 511, a tilting member 515a, the first sidewall part 514, and the second sidewall part 516. Unlike the sensor module 510 of FIG. 3, the sensor module 510b may not include the flange part 517.

The tilting member 515a may include a plurality of push-pull units 5151a that push or pull the sensor housing 513. The push-pull units 5151a may be changed in their longitudinal lengths along the second direction D2. For example, each of the push-pull units 5151a may be or include a pneumatic or hydraulic cylinder, but embodiments are not limited thereto.

FIGS. 10 to 17 illustrate simplified schematic diagrams showing a substrate processing system of FIG. 1 operating in substrate inspection. FIGS. 18A to 18E illustrate cross-sectional views showing an etching process on a substrate of FIG. 1.

Figure 10:
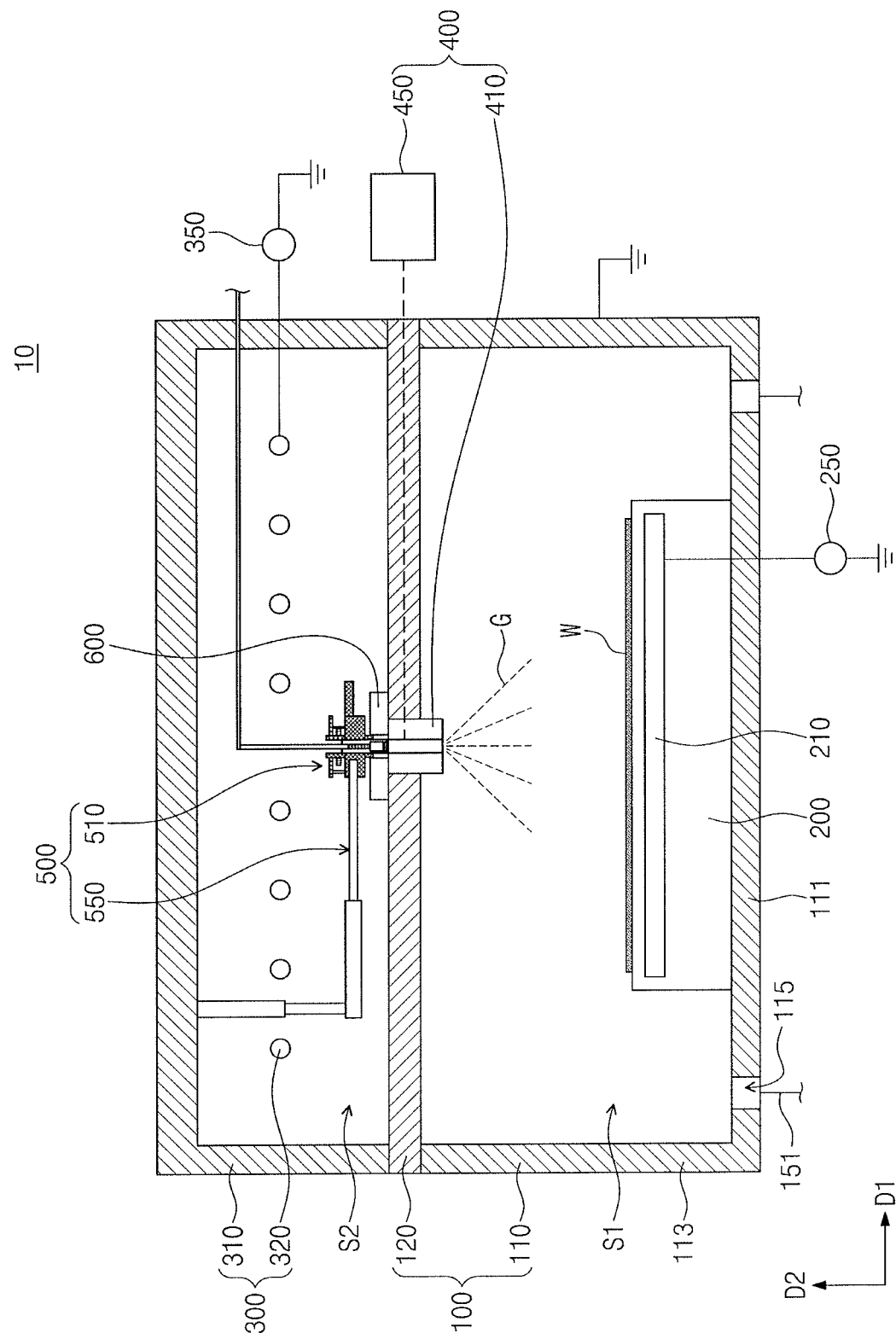
FIGS. 10 to 17 illustrate simplified schematic diagrams showing a substrate processing system of FIG. 1 operating in substrate inspection.

Referring to FIGS. 1, 2, and 10, the injection nozzle 410 may inject a gas G toward the substrate W on the support 200. The plasma source 300 may activate the gas G to generate plasma in the process chamber 100. The first power 250 may apply voltage to the electrostatic electrode 210. Plasma ions may then move toward the substrate W. Accordingly, an etching process may be performed on the substrate W. The etching process on the substrate W will be discussed below with reference to FIGS. 18A to 18E.

Figure 18A:
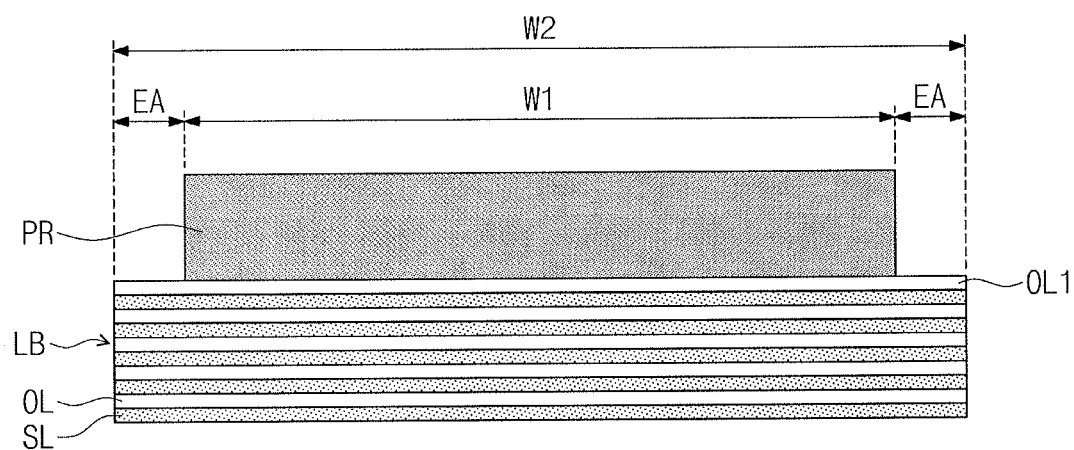
FIGS. 18A to 18E illustrate cross-sectional views showing an etching process on a substrate of FIG. 1.

Referring to FIG. 18A, the substrate W of FIG. 10 may include thereon a layered body LB and a photoresist PR on the layered body LB. The layered body LB may include a plurality of sacrificial layers SL and insulating layers OL between the sacrificial layers SL. In some embodiments, the sacrificial layers SL may include silicon nitride or polysilicon, and the insulating layers OL may include silicon oxide.

The photoresist PR may have a width W1 along the first direction D1 less than a width W2 of the layered body LB. Therefore, the layered body LB may have an exposed area EA not vertically overlapping the photoresist PR along the second direction D2. In some embodiments, a first insulating layer OL1 may have a portion exposed to the outside. The first insulating layer OL1 may be an uppermost one of the insulating layers OL.

Figure 18B:
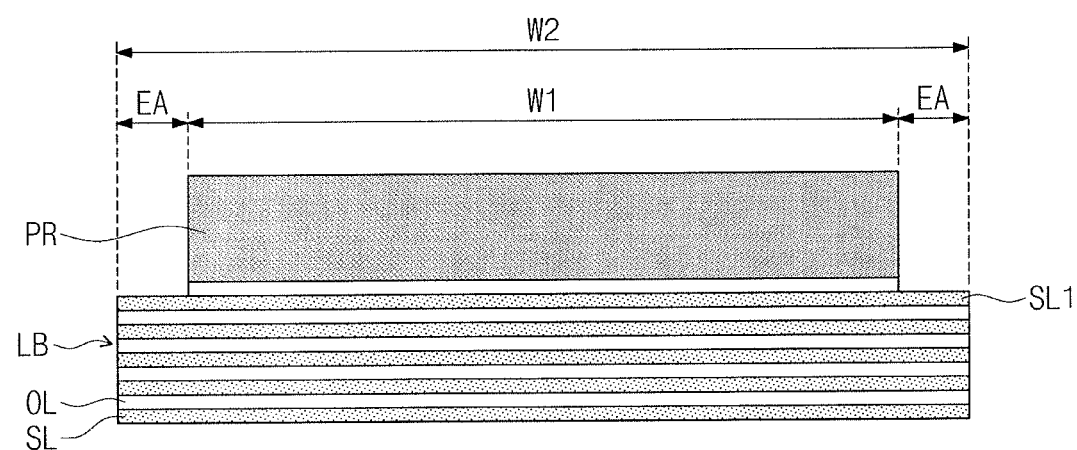

Referring to FIG. 18B, the plasma ions may etch the exposed portion of the first insulting layer OL1. The exposed portion of the first insulating layer OL1 may overlap the exposed area EA. The etching may expose a portion of a first sacrificial layer SL1. The first sacrificial layer SL1 may be an uppermost one of the sacrificial layers SL that is beneath the first insulating layer OL1. The exposed portion of the first sacrificial layer SL1 may overlap the exposed area EA.

Figure 18C:
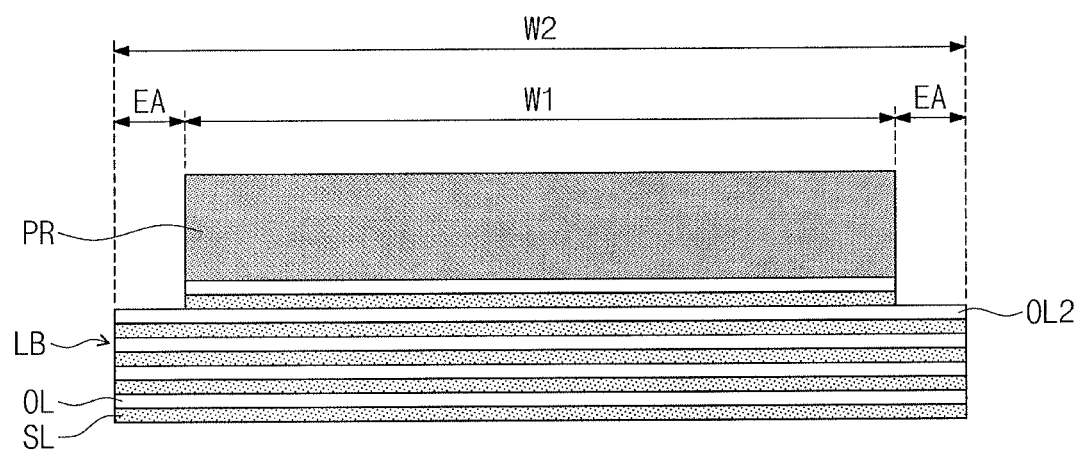

Referring to FIG. 18C, the plasma ions may etch the exposed portion of the first sacrificial layer SL1. Therefore, a portion of a second insulating layer OL2 below the etched first sacrificial layer SL1 may be exposed to the outside. The exposed portion of the second insulating layer OL2 may overlap the exposed area EA.

Figure 18D:
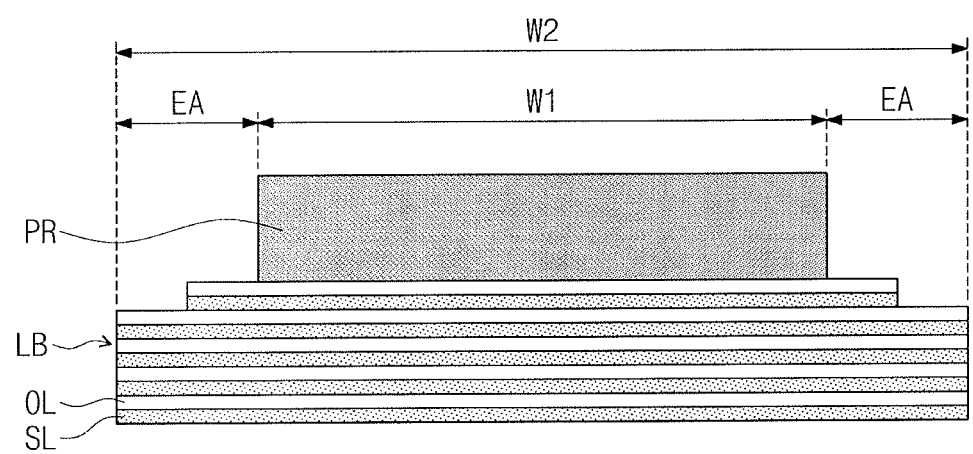

Referring to FIG. 18D, after etching the first insulating layer OL1 and the first sacrificial layer SL1, the photoresist PR may be partially etched. The partial etching may decrease the width W1 of the photoresist PR. As the width W1 of the photoresist PR decreases, the exposed area EA may increase. For example, since the photoresist PR is partially etched, the first insulating layer OL1 may be exposed again to the outside. Thus, a first period of an etching cycle may be terminated. In the first period of the etching cycle, each of the insulating layer OL, the sacrificial layer SL, and the photoresist PR may be etched at once.

Figure 18E:
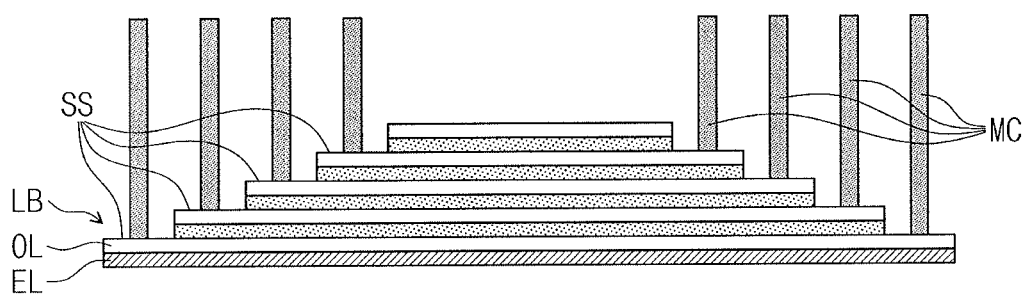

Referring to FIG. 18E, the etching cycle may be performed at several times, and therefore the layered body LB may have stepwise surfaces SS. The sacrificial layers (see SL of FIG. 18D) may be replaced with electrodes EL. For example, the sacrificial layers SL may be removed, and then the electrodes EL may fill spaces where the sacrificial layers SL are removed. In other embodiments, electrodes including conductive materials (e.g., polysilicon) may be formed between the insulating layers OL, and in this case the replacement process may not be required.

Metal contacts MC may be formed on corresponding stepwise surfaces SS. For example, the metal contacts MC may penetrate the insulating layers OL to come into connection with underlying electrodes EL. In order to place the metal contacts MC in right position on the stepwise surfaces SS, it may be necessary that the photoresist (see PR of FIG. 18D) be desirably etched. For example, whenever the photoresist PR is etched, the width W1 of the photoresist PR may essentially have a desired value. Accordingly, whenever the photoresist PR is etched, it may be required that an inspection be performed to determine whether or not the width W1 of the photoresist PR has the desired value. This will be further discussed in detail below.

Figure 11:
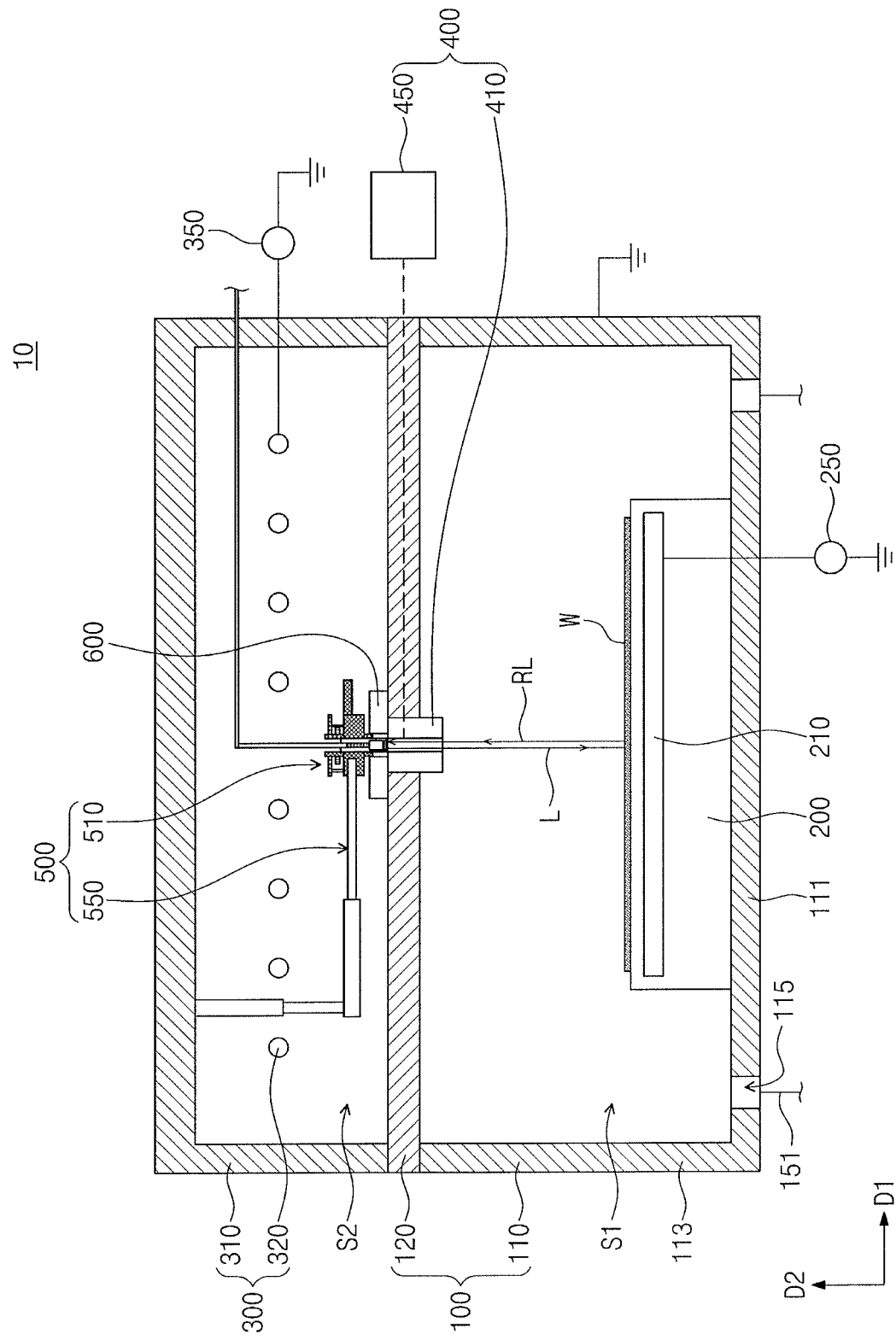

Referring to FIGS. 1, 2, and 11, after the first period of the etching cycle on the substrate W, the sensor (see 511 of FIG. 2) of the sensor module 510 may irradiate light L toward the support 200. In this step, the sensor 511 may vertically overlap the injection hole (see 415 of FIG. 2) of the injection nozzle 410. The light L irradiated from the sensor 511 may be reflected from the substrate W on the support 200. The sensor 511 may receive the light L reflected from the substrate W. The sensor 511 may measure a state of the substrate W, and then obtain a substrate state information. For example, the sensor 511 may obtain information about the width W1 of the photoresist PR discussed above with reference to FIG. 18D.

The obtained substrate state information may be transmitted into the controller. The controller may use the substrate state information to monitor how the photoresist PR is etched. In addition, the controller may use the substrate state information to predict defects of the substrate W.

Figure 12:
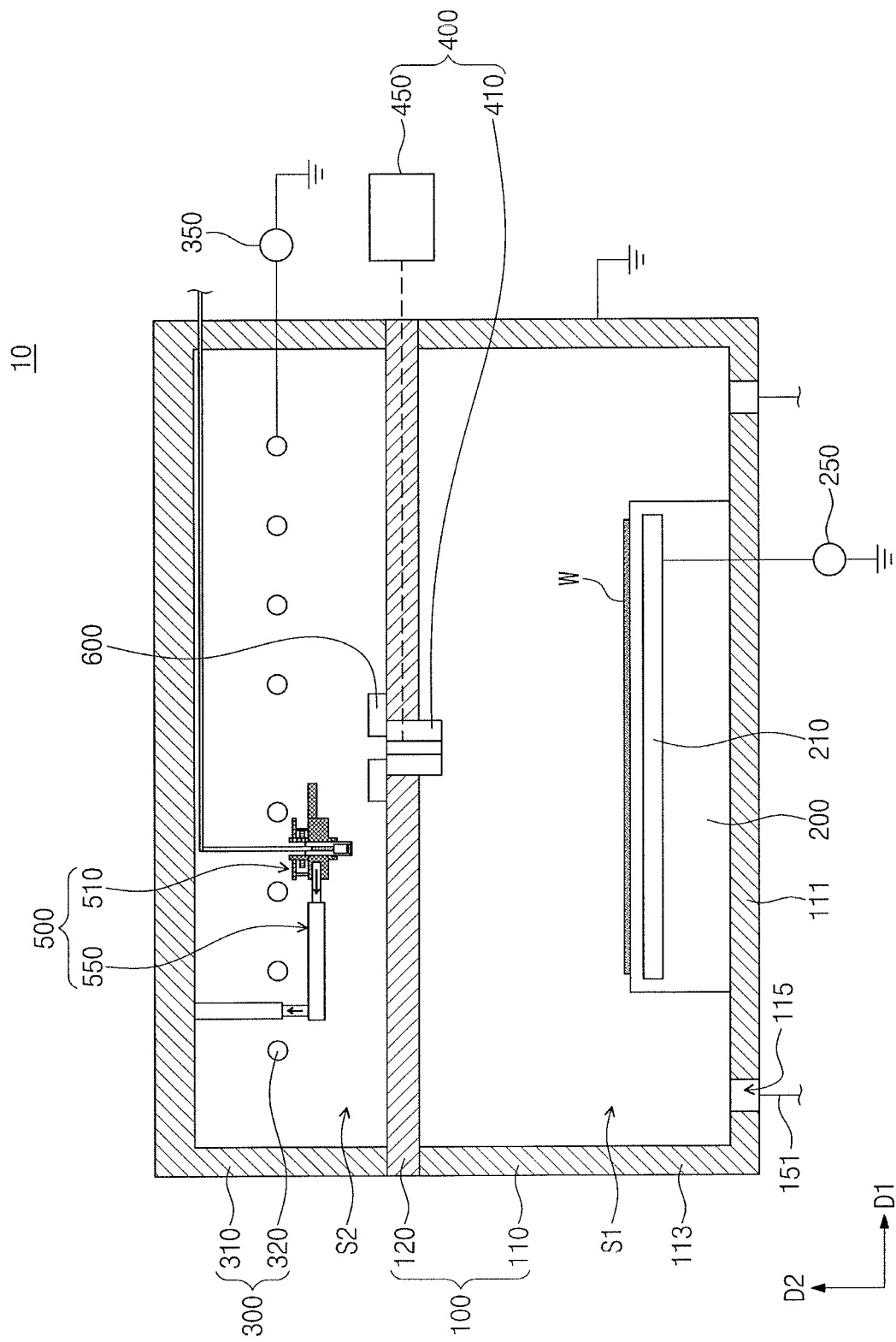
Figure 13:
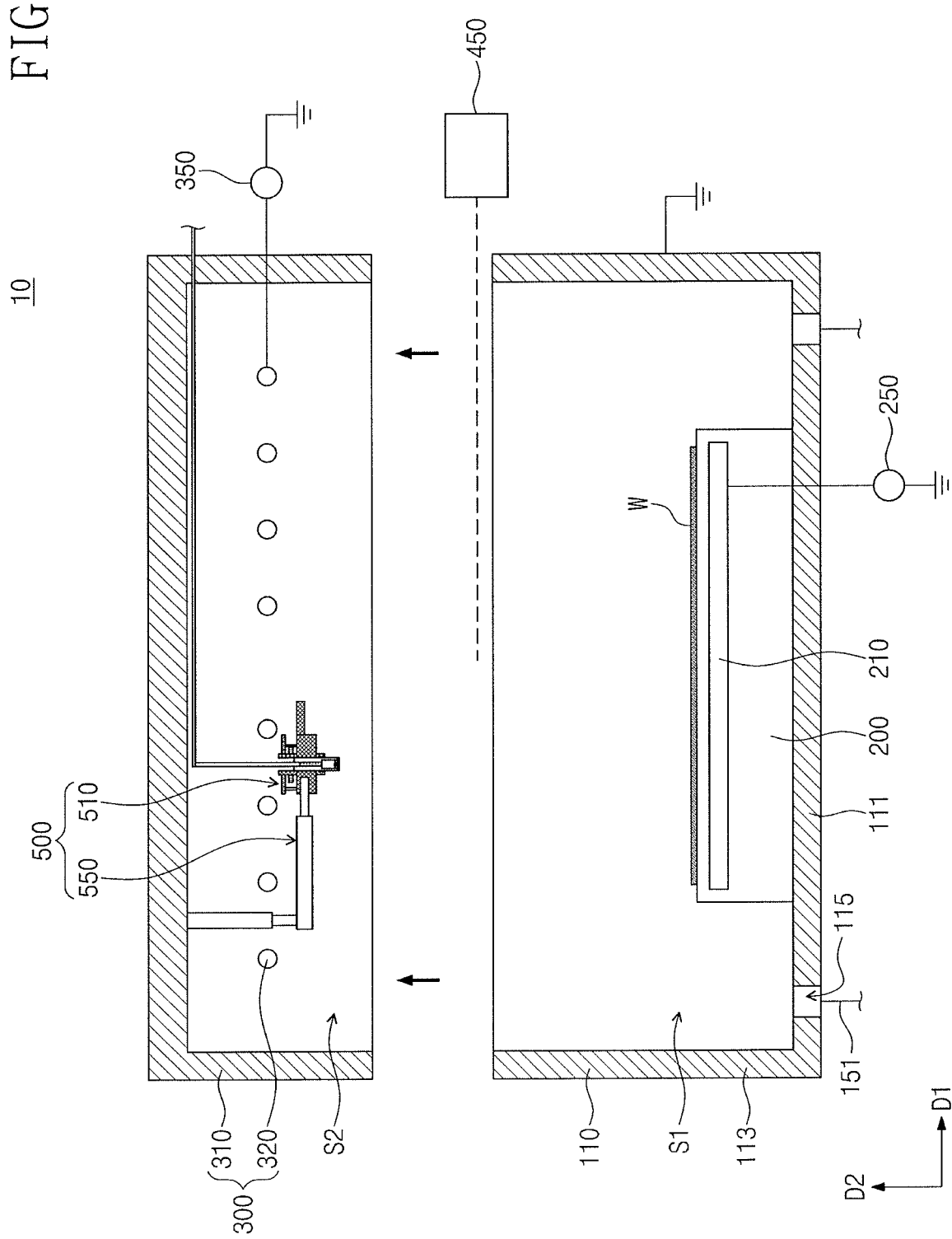

Referring to FIGS. 1, 12, and 13, when the substrate W is etched, the plasma may damage components including the process chamber 100, the injection nozzle 410, the window 120, and the like. Therefore, after the substrate W is etched more than a certain number of times, components including the process chamber 100, the injection nozzle 410, the window 120, and the like may need to be replaced or cleaned.

In some embodiments, the jig 550 may unload the sensor module 510 from the loading member 600. For example, the jig 550 may lift the sensor module 510 along the second direction D2, and then move the sensor module 510 in along the first direction D1. Accordingly, when the window 120 and the injection nozzle 410 are replaced, interference may be prevented between the sensor module 510 and the window 120.

The antenna room 310 may move in the second direction D2. The antenna room 310 may thus be separated from the process chamber 100. After the antenna room 310 is separated from the process chamber 100, components including the window 120, the injection nozzle 410, and the like may be replaced. Moreover, a cleaning process may be performed on components including the process chamber 100, the support 200, and the like.

Figure 14:
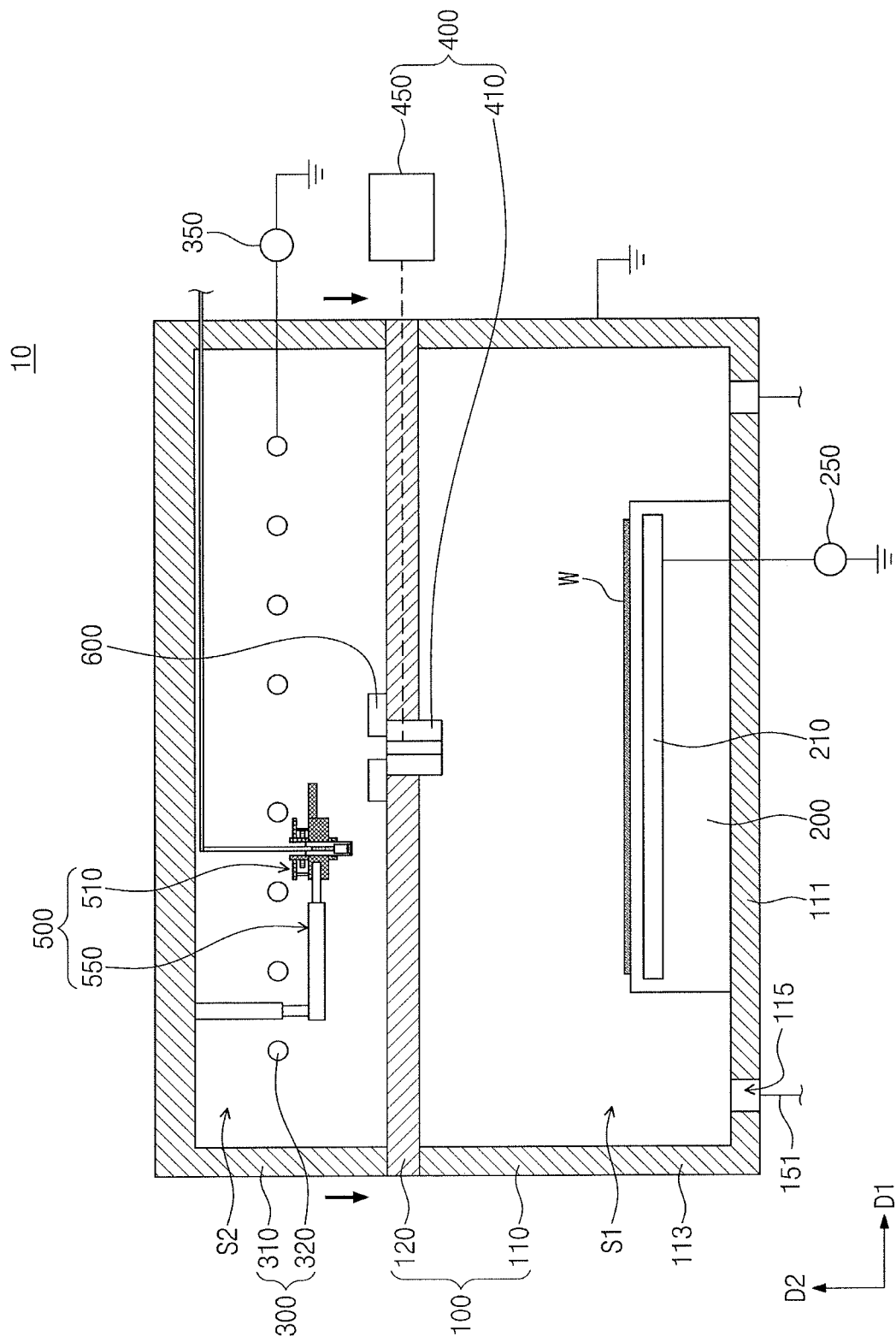

Referring to FIG. 14, after replacing components including the window 120, the injection nozzle 410, and the like, and after cleaning components including the process chamber 100, the support 200, and the like, an assembling process may be performed on the antenna room 310 and the process chamber 100. For example, the antenna room 310 may move toward a replaced window 120, and may then be assembled to the process chamber 100.

Figure 15:
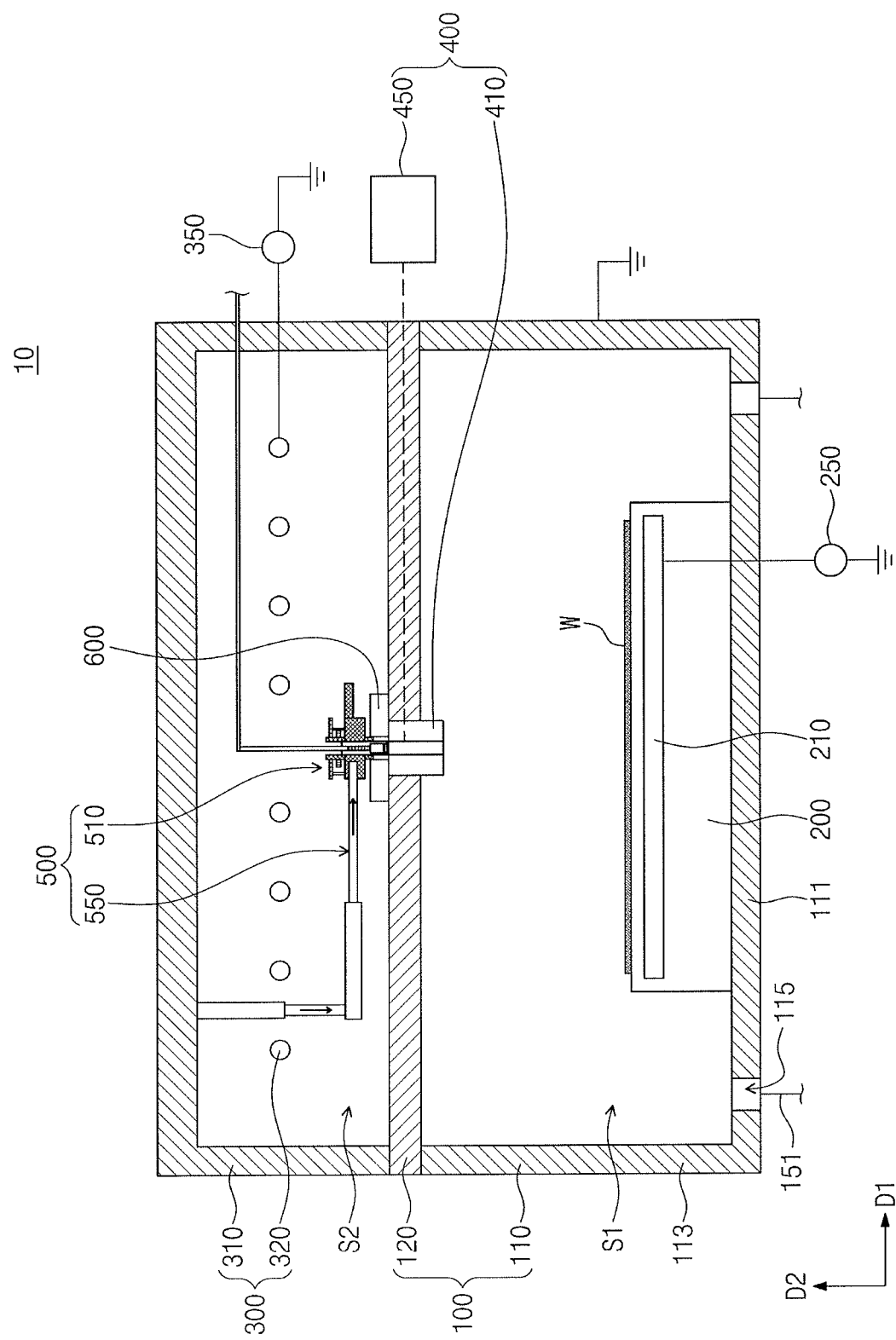

Referring to FIG. 15, the jig 550 may reload the sensor module 510 on the loading member 600. For example, the jig 550 may transfer the sensor module 510 in the first direction D1, and then lower the sensor module 510 along the second direction D2.

Figure 16:
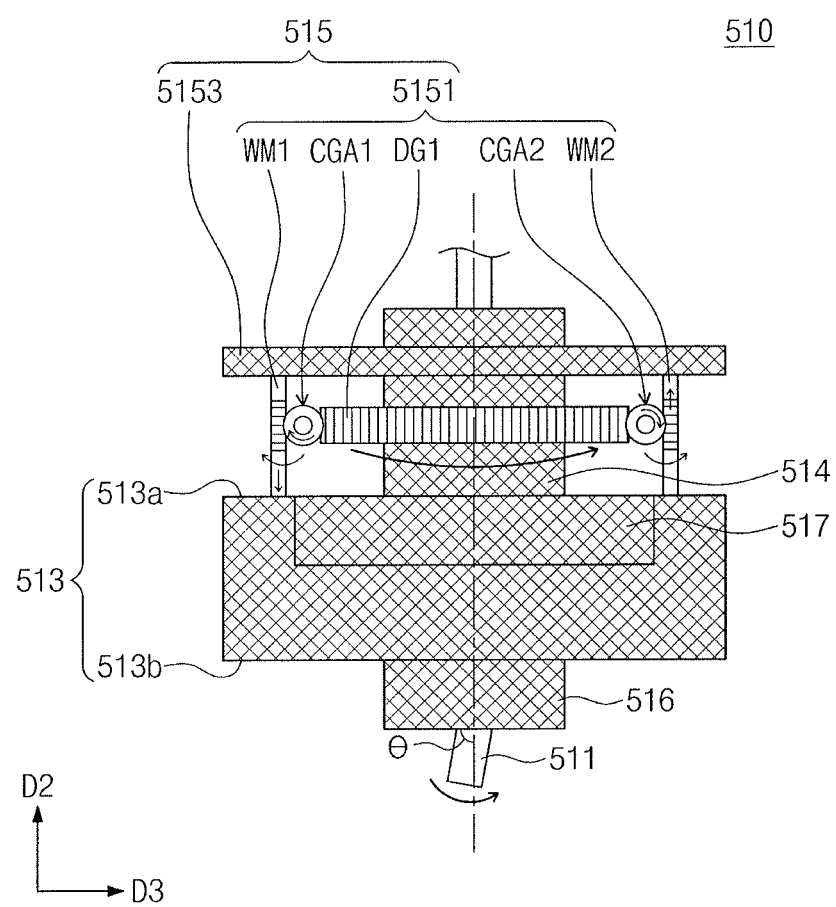
Figure 17:
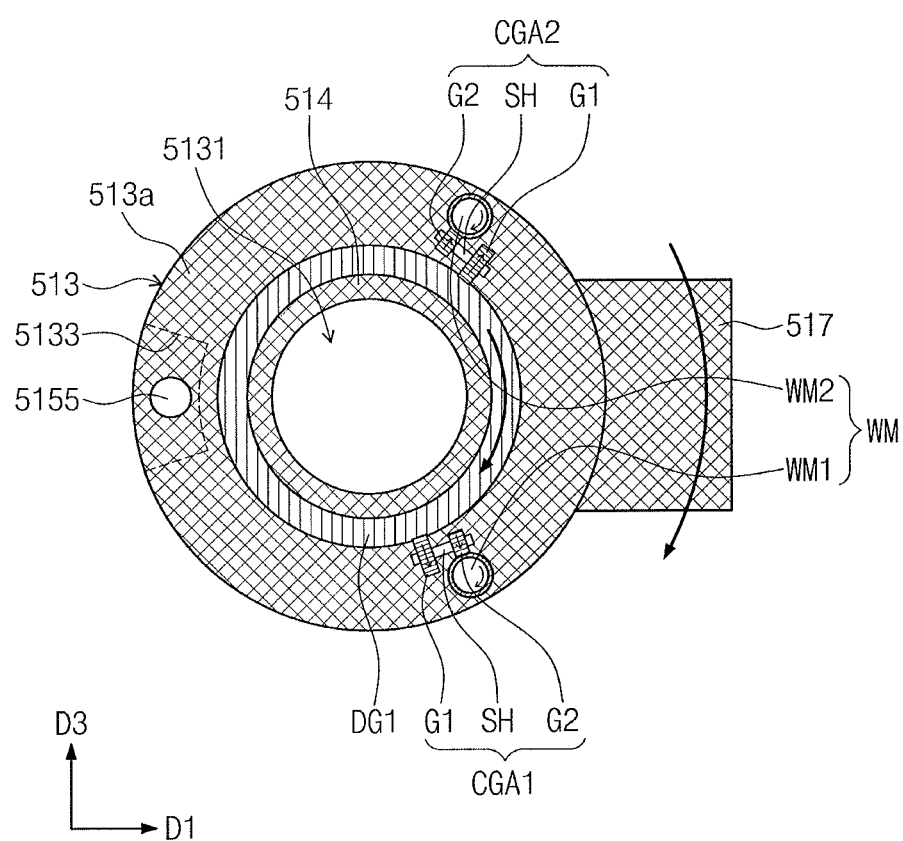

Referring to FIGS. 16 and 17, the sensor 511 of the sensor module 510 reloaded on the loading member 600 may be inclined at an angle θ relative to the second direction D2. In this case, the sensor 511 may inaccurately measure the state of the substrate W. For example, the sensor 511 may inaccurately measure the width W1 of the photoresist PR discussed with reference to FIGS. 18A to 18E. In order to cause the sensor 511 to accurately measure the state of the substrate W, it may be necessary that the sensor 511 be positioned parallel, or approximately parallel, to the second direction D2. For example, a wafer having a pattern with a known width may be provided and the tilting member 515 may adjust the tilt of the sensor 511 via the sensor housing 513 may be tilted until a correct measurement is realized.

In order to place the sensor 511 parallel, or approximately parallel, to the second direction D2, an external force may be provided to rotate the flange part 517 in a counterclockwise direction, when viewed in plan. In this case, the sensor housing 513 and the first driving gear DG1 may also rotate in the counterclockwise direction.

As the first and second connection gear assembles CGA1 and CGA2 have the first gears G1 engaged with the first driving gear DG1 as discussed above, when the first driving gear DG1 rotates in the counterclockwise direction, the first gears G1 may rotate in a clockwise direction. When the first gears G1 rotate in the clockwise direction, the connection shafts SH and the second gears G2 may rotate in the clockwise direction. Accordingly, the first and second worms WM1 and WM2 engaged with the second gears G2 may rotate in the counterclockwise direction.

As the first worm WM1 rotates in the counterclockwise direction, the first worm WM1 may straightly move toward the sensor housing 513. In this case, the first worm WM1 may push the sensor housing 513. As the second worm WM2 rotates in the counterclockwise direction, the second worm WM2 may straightly move toward the support member 5153. In this case, the second worm WM2 may pull the sensor housing 513. The opposite moving directions of the first and second worms WM1 and WM2 may cause the sensor housing 513 to tilt at an angle θ relative to the second direction D2. As the sensor housing 513 tilts at the angle θ, the sensor 511 may become parallel to the second direction D2.

According to exemplary embodiments, the jig may operate such that the sensor module is automatically separated from and assembled to the process chamber. Moreover, when the sensor module is reassembled to the process chamber, the sensor module may be prevented from being inclined.

Exemplary embodiments provide a substrate inspection apparatus capable of accurately loading a sensor module on a process chamber when the sensor module is re-assembled to the process chamber, and a substrate processing system including the substrate inspection apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate inspection apparatus, comprising:
a sensor device; and
a moveable frame coupled to the sensor device to transfer the sensor device,
wherein the sensor device includes:
 a housing having a first surface and a second surface facing each other and including an insertion hole connecting the first and second surfaces to each other;
 an optical sensor inserted into the insertion hole to measure a state of the substrate; and
a tilting support on the housing, the tilting support to adjust a tilt of the housing.

2. The apparatus as claimed in claim 1, wherein the tilting support includes:
a supporter spaced apart from the first surface of the housing;
a fixer between the supporter and the first surface of the housing, the fixer connecting the supporter and the housing to each other; and
a first driver between the supporter and the first surface of the housing, the first driver to push or pull the housing.

3. The apparatus as claimed in claim 2, wherein:
the sensor device further includes a first sidewall part on the first surface and surrounding the insertion hole, and
the first driver includes:
 a main gear on and surrounding the first sidewall part;
 at least one worm spaced apart from the main gear and rotatably installed on the supporter and the housing; and
 at least one connector between the main gear and the at least one worm, the at least one connector to transmit a rotational force of the main gear to the at least one worm.

4. The apparatus as claimed in claim 3, wherein the at least one connector includes:
a connection shaft vertical to a longitudinal direction of the at least one worm;
a first gear on the connection shaft and engaged with the main gear; and
a second gear on the connection shaft and engaged with the at least one worm.

5. The apparatus as claimed in claim 3, wherein:
each of the at least one worm and the at least one connector is provided in plural,
the fixer and the plurality of worms are arranged at an equal distance along a circumference of the main gear, and
the plurality of connectors are provided between the main gear and the plurality of worms.

6. The apparatus as claimed in claim 3, wherein the moveable frame includes a second driver that rotates the main gear of the first driver.

7. The apparatus as claimed in claim 1, wherein the moveable frame includes:
a bar-shaped frame;
a translation mover to move the bar-shaped frame along a longitudinal direction of the bar-shaped frame; and
a lifter to move the bar-shaped frame along a direction perpendicular to the longitudinal direction.

8. The apparatus as claimed in claim 7, wherein the housing includes a coupling groove into which the bar-shaped frame is received.

9. The apparatus as claimed in claim 8, wherein the coupling groove extends along a circumference of the housing.

10. The apparatus as claimed in claim 1, further comprising a flange extending from the housing in a direction away from the insertion hole.

11. A substrate processing system, comprising:
a process chamber;
a holder in the process chamber to hold a substrate;
a gas supply to supply a gas into the process chamber;
a plasma source to generate plasma from the gas supplied into the process chamber; and
a substrate inspection assembly apparatus spaced apart from the holder across the process chamber, the substrate inspection apparatus including:
a sensor device; and
a moveable frame coupled to the sensor device that drives the sensor device relative to the process chamber,
wherein the sensor device includes:
a housing including an insertion hole penetrating the housing between facing first and second surfaces;
an optical sensor inserted into the insertion hole, the optical sensor to measure a state of the substrate on the holder; and
a tilting support on the housing to adjust a tilt of the housing.

12. The system as claimed in claim 11, wherein:
the process chamber includes:
a window between the holder and the substrate inspection apparatus, and
an aperture penetrating the window,
the gas supply includes an injection nozzle inserted into the aperture and including an injection hole that provides the gas into the process chamber, and
the moveable frame transfers the sensor device such that the sensor device and the injection nozzle overlap each other.

13. The system as claimed in claim 11, wherein the tilting support includes:
a supporter spaced apart from the housing in a direction away from the holder;
a fixer connecting the supporter and the housing to each other and fixing the supporter on the housing; and
a first driver between the supporter and the housing, the first driver to push or pull the housing.

14. The system as claimed in claim 13, wherein:
the sensor device further includes a first sidewall part extending from the housing toward the supporter and surrounding the insertion hole, and
the first driver includes:
a main gear on and surrounding the first sidewall part;
at least one worm spaced apart from the main gear and rotatably installed on the supporter and the housing; and
at least one connector between the main gear and the at least one worm, the at least one connector to transmit a rotational force of the main gear to the at least one worm.

15. The system as claimed in claim 14, wherein the at least one connector includes:
a connection shaft vertical to a longitudinal direction of the at least one worm;
a first gear on the connection shaft and engaged with the main gear; and
a second gear on the connection shaft and engaged with the at least one worm.

16. The system as claimed in claim 14, wherein each of the at least one worm and the at least one connector is provided in plural,
the fixer and the plurality of worms being arranged at an equal distance along a circumference of the main gear, and
the plurality of connectors are provided between the main gear and the plurality of worms.

17. The system as claimed in claim 14, wherein the moveable frame includes a second driver that rotates the main gear of the first driver.

18. The system as claimed in claim 11, wherein the moveable frame includes:
a bar-shaped frame;
a mover that moves the bar-shaped frame along a longitudinal direction of the bar-shaped frame; and
bar-shaped that moves the bar-shaped frame along a direction perpendicular to the longitudinal direction.

19. The system as claimed in claim 18, wherein the housing includes a coupling groove into which the bar-shaped frame is received.

20. The system as claimed in claim 11, wherein the plasma source includes:
an antenna room on the process chamber and having an inner space; and
an antenna in the antenna room, the substrate inspection apparatus is installed in the antenna room.

* * * * *